(12) United States Patent
Anderson et al.

(10) Patent No.: US 12,356,709 B2
(45) Date of Patent: Jul. 8, 2025

(54) VERTICAL FIELD-EFFECT TRANSISTOR WITH ISOLATION PILLARS

(71) Applicant: International Business Machines Corporation, Armonk, NY (US)

(72) Inventors: Brent A. Anderson, Jericho, VT (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 421 days.

(21) Appl. No.: 17/895,299

(22) Filed: Aug. 25, 2022

(65) Prior Publication Data

US 2024/0072051 A1 Feb. 29, 2024

(51) Int. Cl.
| | |
|---|---|
| *H10D 84/85* | (2025.01) |
| *H10D 30/01* | (2025.01) |
| *H10D 30/63* | (2025.01) |
| *H10D 62/13* | (2025.01) |
| *H10D 64/23* | (2025.01) |
| *H10D 84/01* | (2025.01) |
| *H10D 84/03* | (2025.01) |

(52) U.S. Cl.
CPC .......... *H10D 84/85* (2025.01); *H10D 30/025* (2025.01); *H10D 30/63* (2025.01); *H10D 62/151* (2025.01); *H10D 64/252* (2025.01); *H10D 84/0188* (2025.01); *H10D 84/0195* (2025.01); *H10D 84/038* (2025.01)

(58) Field of Classification Search
CPC .......... H01L 27/092; H01L 21/823878; H01L 21/823885; H01L 29/0847; H01L 29/41741; H01L 29/66666; H01L 29/7827; H01L 21/823475; H01L 21/823481; H01L 27/088; H01L 21/823487

USPC .......................................... 257/329
See application file for complete search history.

(56) References Cited

U.S. PATENT DOCUMENTS

| | | | |
|---|---|---|---|
| 9,312,220 B2 | 4/2016 | Lu et al. | |
| 9,356,043 B1 | 5/2016 | Sakakibara et al. | |
| 9,595,535 B1 | 3/2017 | Ogawa et al. | |
| 9,799,570 B1 * | 10/2017 | Cheng ................ | H01L 21/762 |
| 9,799,670 B2 | 10/2017 | Nishikawa et al. | |
| 9,812,461 B2 | 11/2017 | Doda et al. | |
| 10,079,230 B2 | 9/2018 | Stuber et al. | |

(Continued)

FOREIGN PATENT DOCUMENTS

| | | |
|---|---|---|
| CN | 114725096 A | 7/2022 |
| WO | 2007002857 A2 | 1/2007 |
| WO | PCT/EP2023/071613 | 11/2023 |

OTHER PUBLICATIONS

D. Monroe et al., "Challenges of Gate-Dielectric Scaling, Including the Vertical Replacement-Gate MOSFET," AIP Conference Proceedings, Mar. 28, 2001, pp. 97-104, vol. 550, No. 97.

*Primary Examiner* — Mohammad M Hoque
(74) *Attorney, Agent, or Firm* — Kimberly Zillig; Ryan, Mason & Lewis, LLP

(57) ABSTRACT

A semiconductor device includes a first vertical field-effect transistor comprising a first set of vertical fins and a second set of vertical fins separated by a first isolation pillar structure. The semiconductor device further includes a second vertical field-effect transistor adjacent to the first vertical field-effect transistor, the second vertical field-effect transistor comprising a first set of vertical fins and a second set of vertical fins separated by a second isolation pillar structure.

20 Claims, 17 Drawing Sheets

(56) References Cited

U.S. PATENT DOCUMENTS

| | | |
|---|---|---|
| 10,242,994 B2 | 3/2019 | Inomata et al. |
| 10,699,957 B2 | 6/2020 | Zang et al. |
| 2013/0270629 A1* | 10/2013 | Ikebuchi ............... H10D 62/126 257/329 |
| 2017/0294377 A1 | 10/2017 | Dunga et al. |
| 2018/0190670 A1 | 7/2018 | Ryckaert et al. |
| 2018/0315850 A1 | 11/2018 | Liu et al. |
| 2019/0051733 A1 | 2/2019 | Zang |
| 2019/0295898 A1 | 9/2019 | Xie et al. |
| 2020/0119010 A1 | 4/2020 | Lee et al. |
| 2021/0327766 A1 | 10/2021 | Wang et al. |
| 2021/0328056 A1 | 10/2021 | Baek et al. |
| 2021/0399016 A1 | 12/2021 | Jiang et al. |
| 2022/0302255 A1* | 9/2022 | Peng ............... H01L 21/823871 |

* cited by examiner

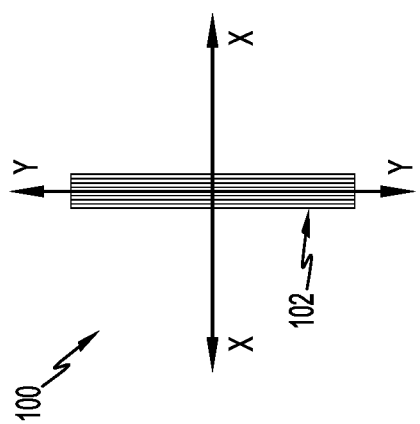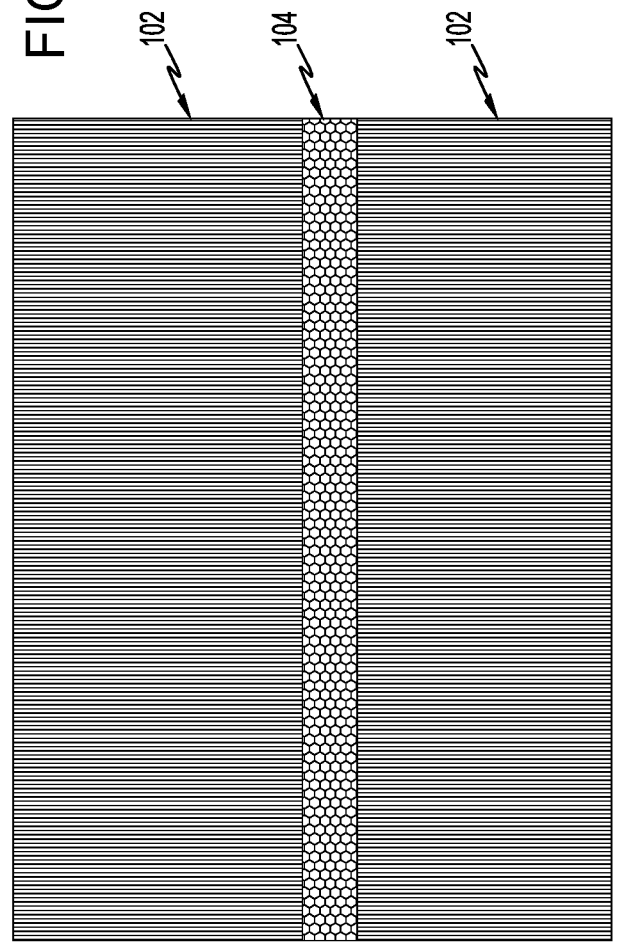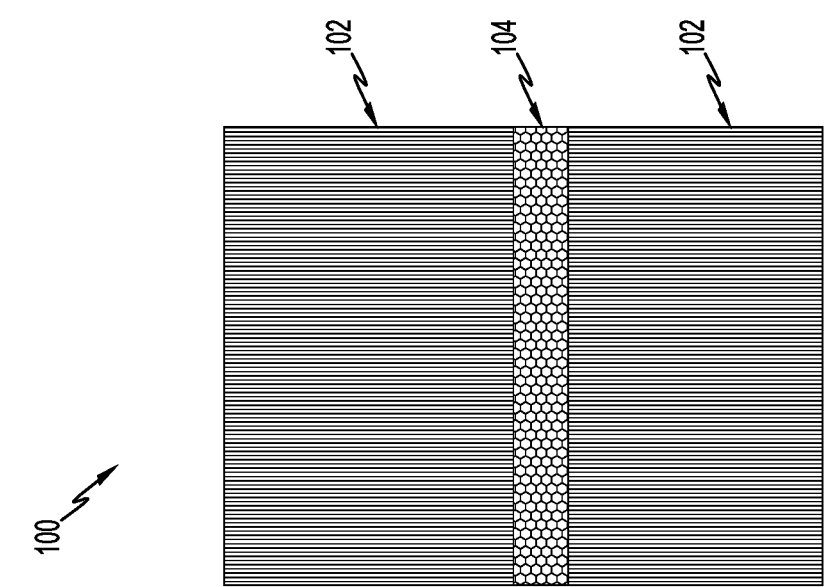

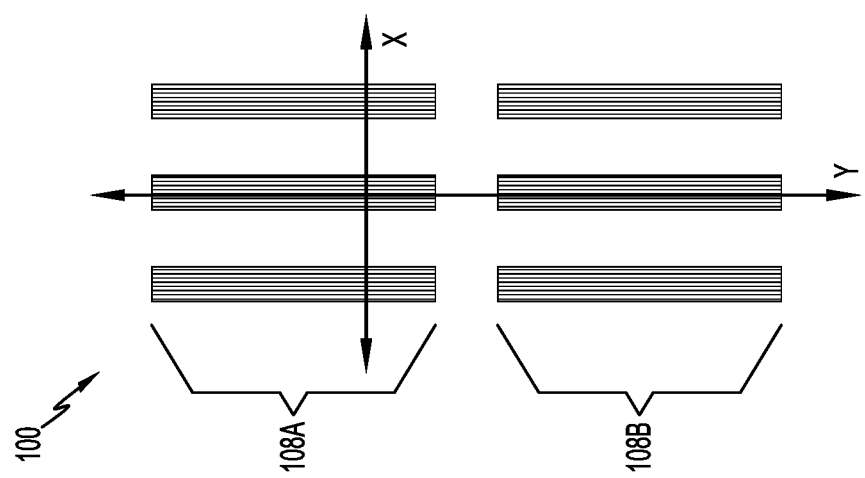

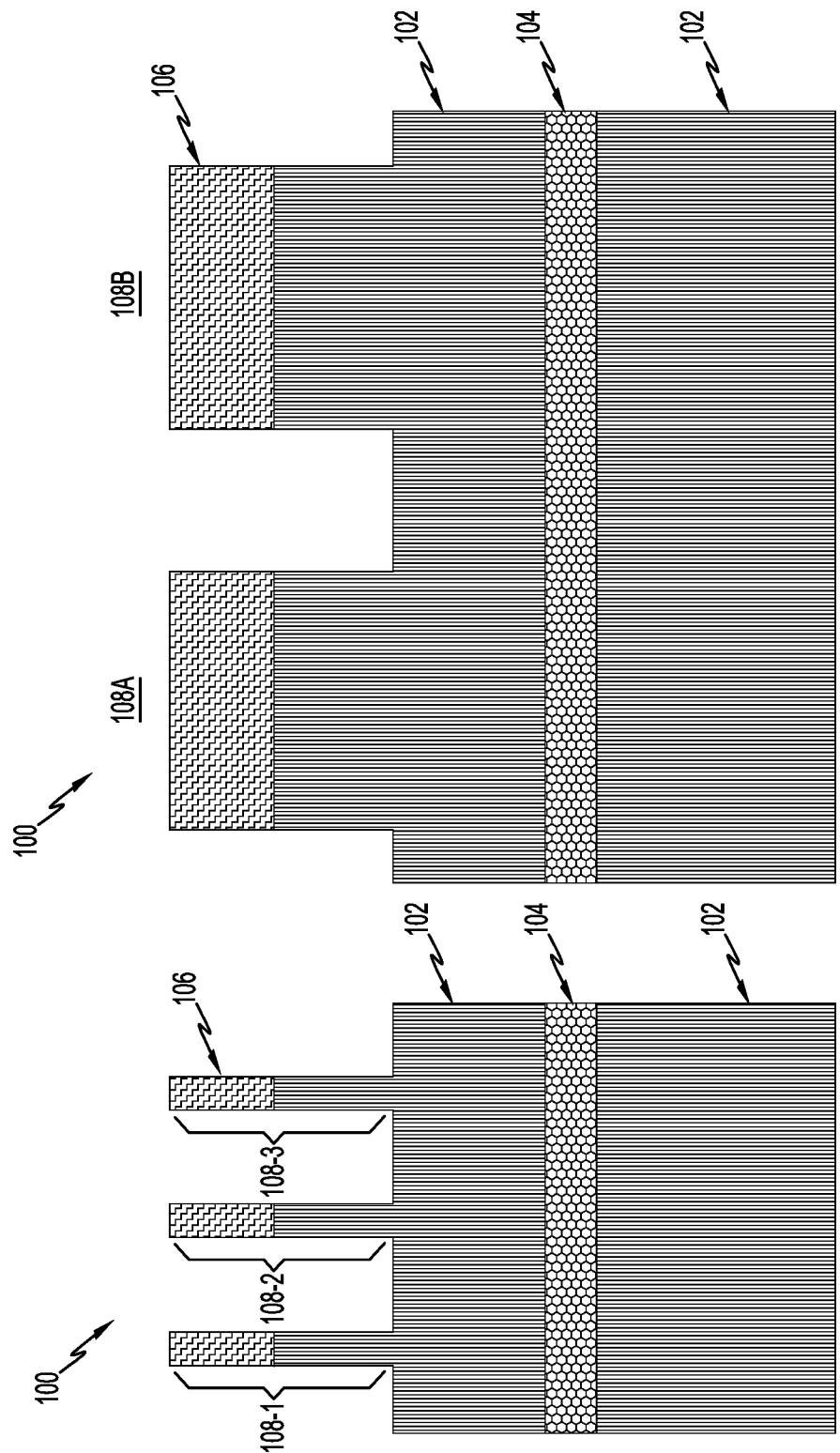

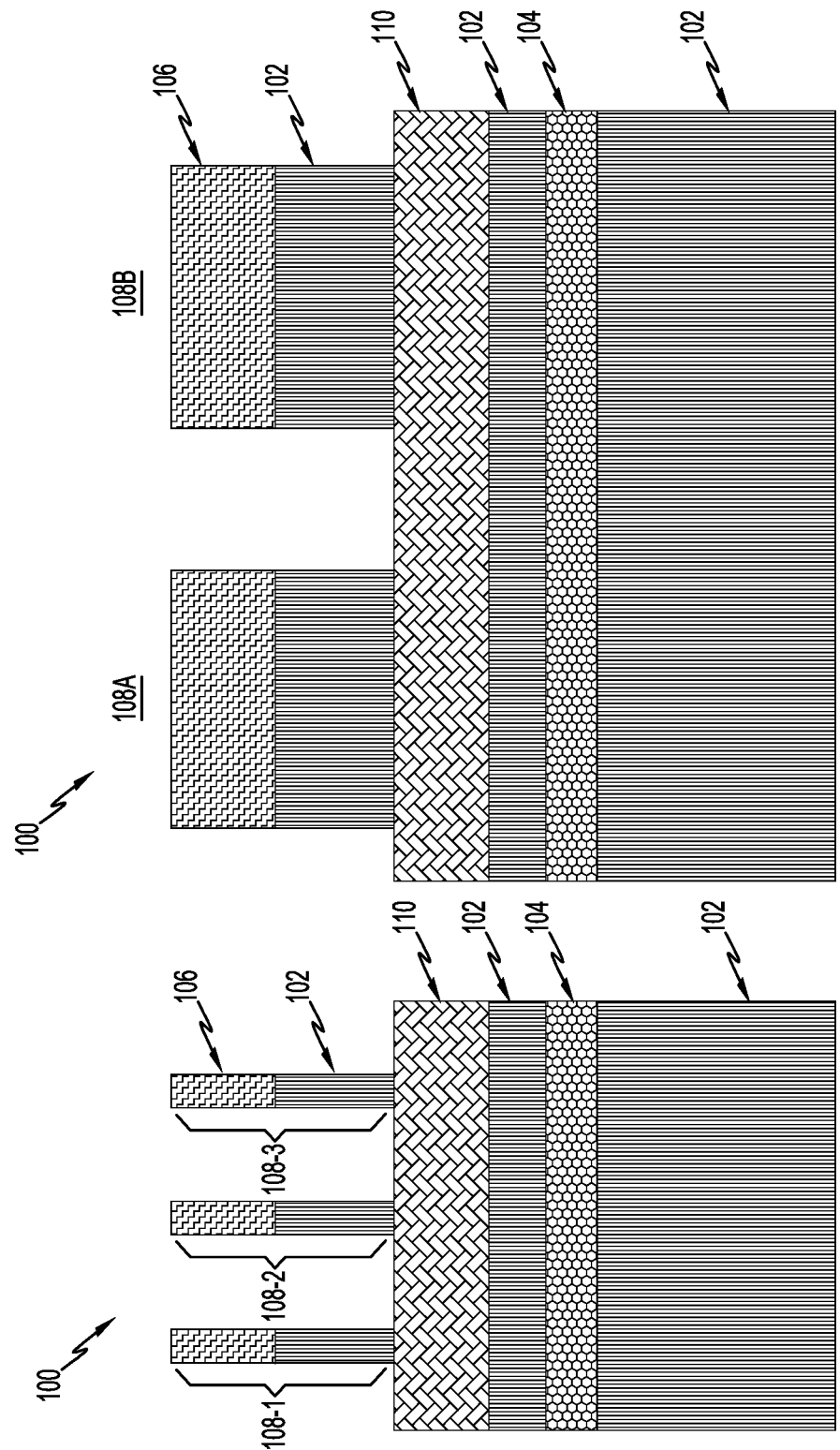

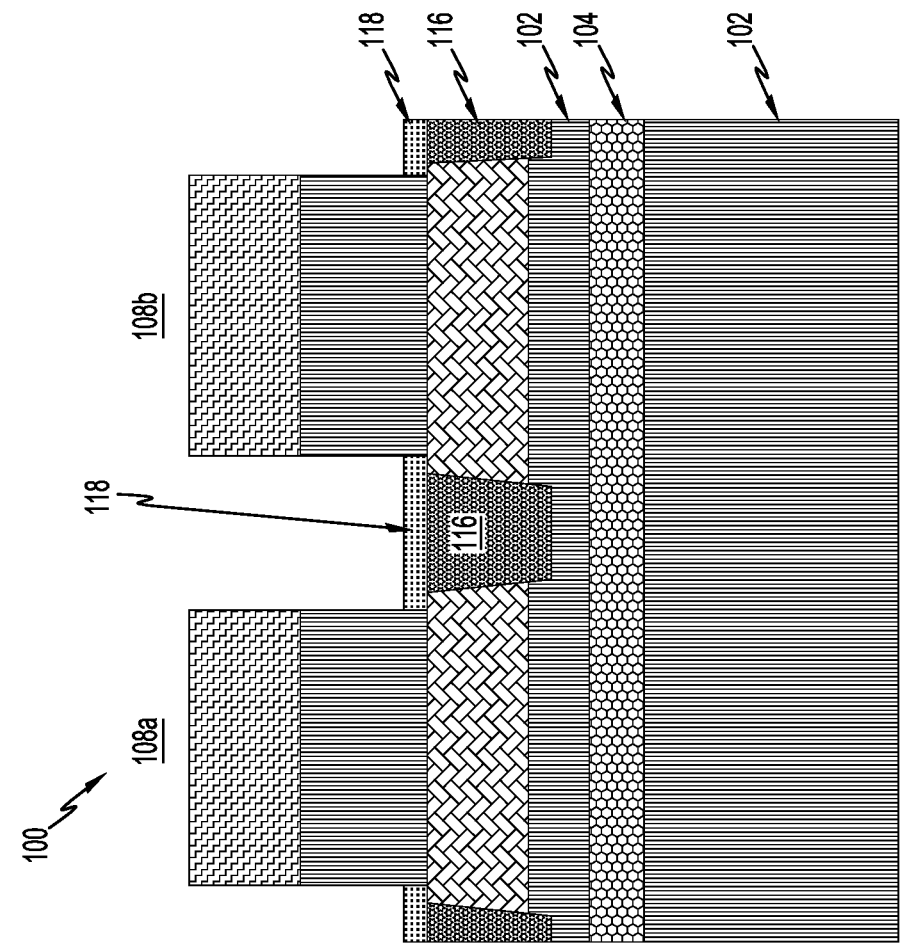
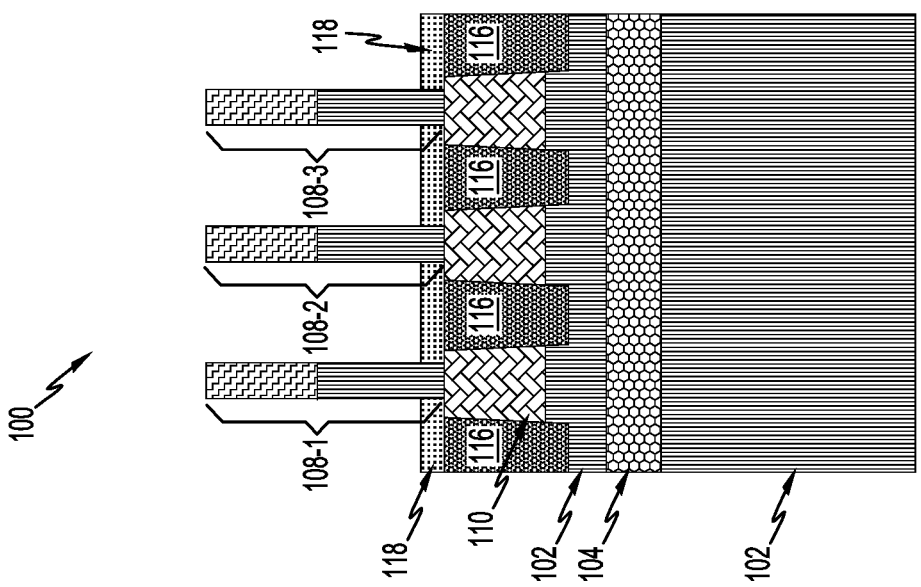
FIG. 5A
FIG. 5B

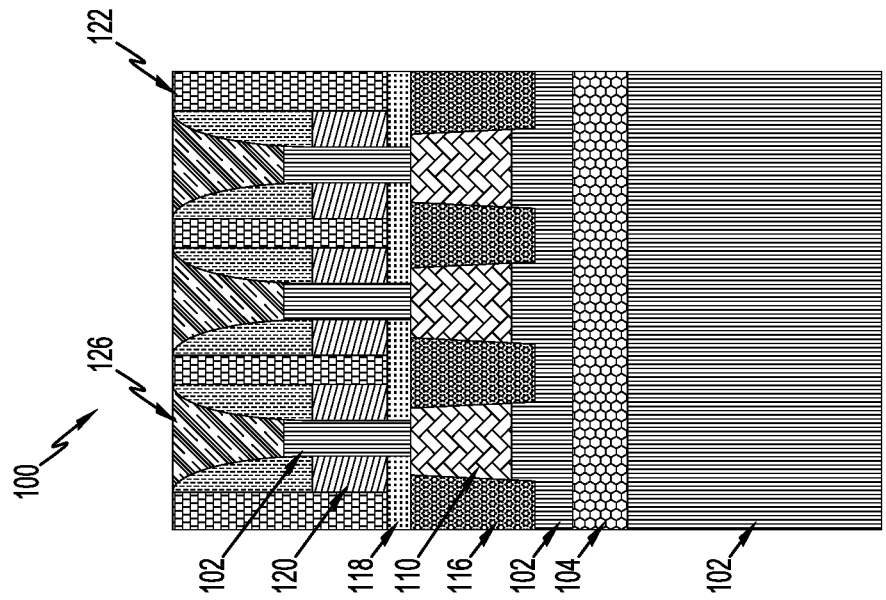
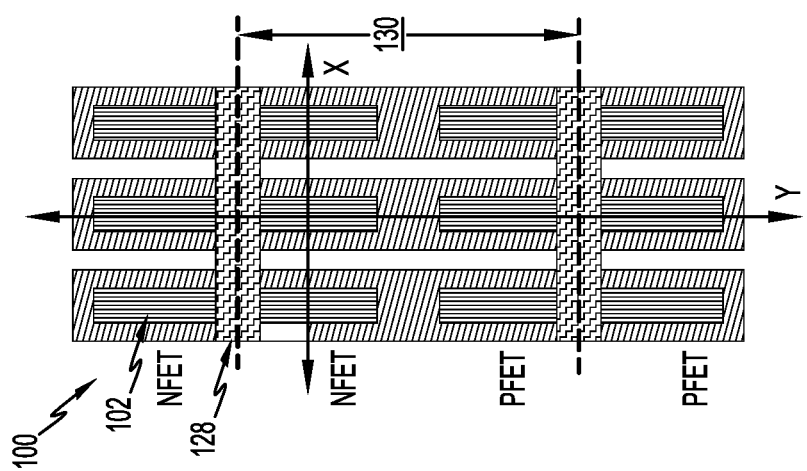
FIG. 8B
FIG. 8A

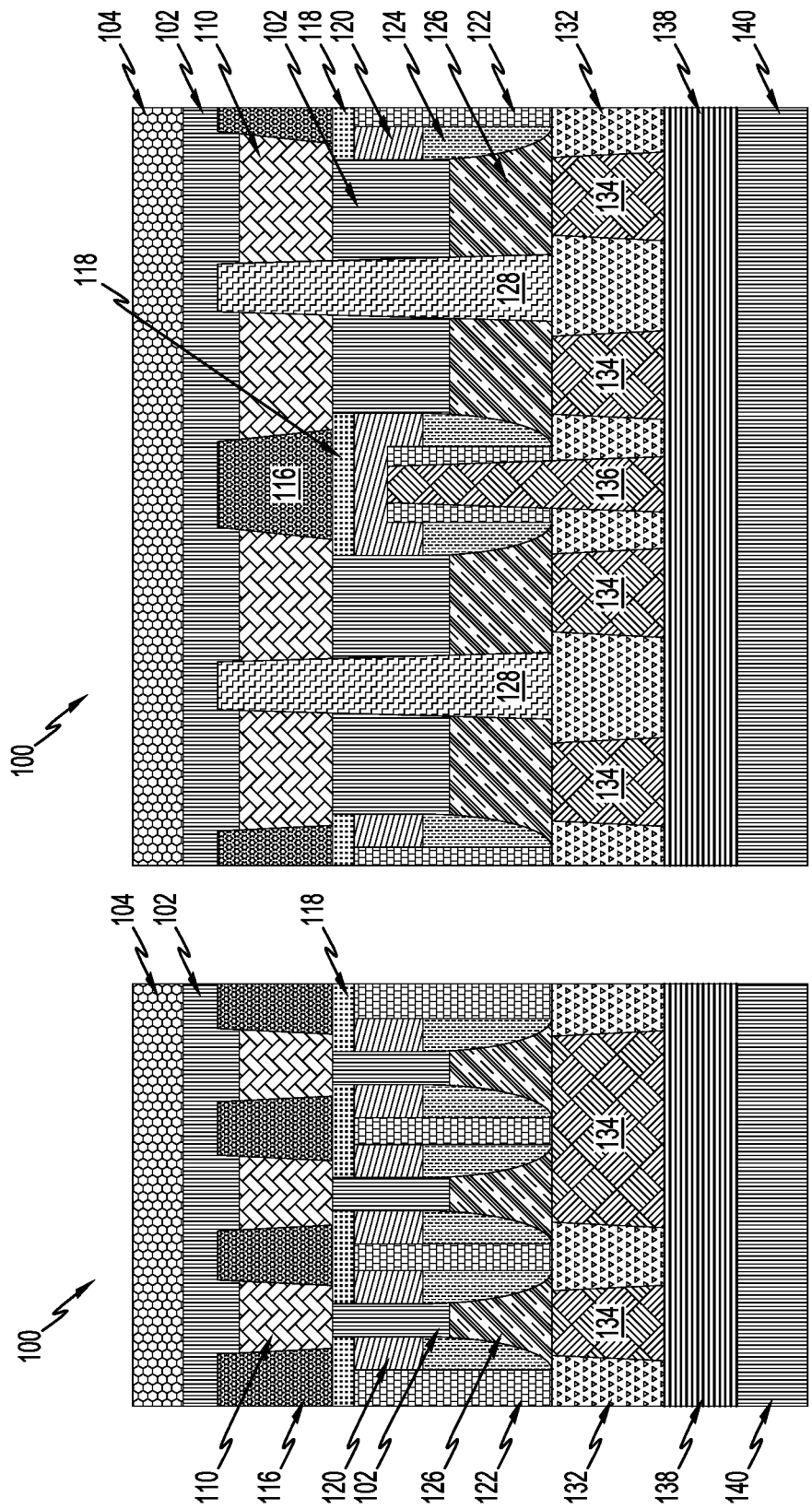

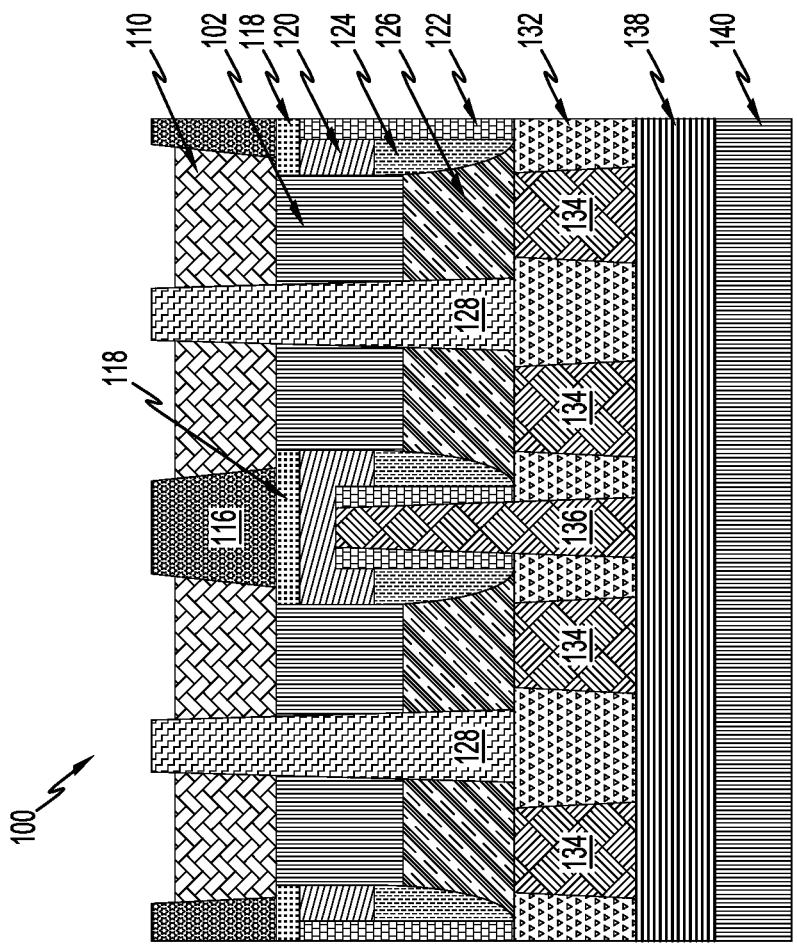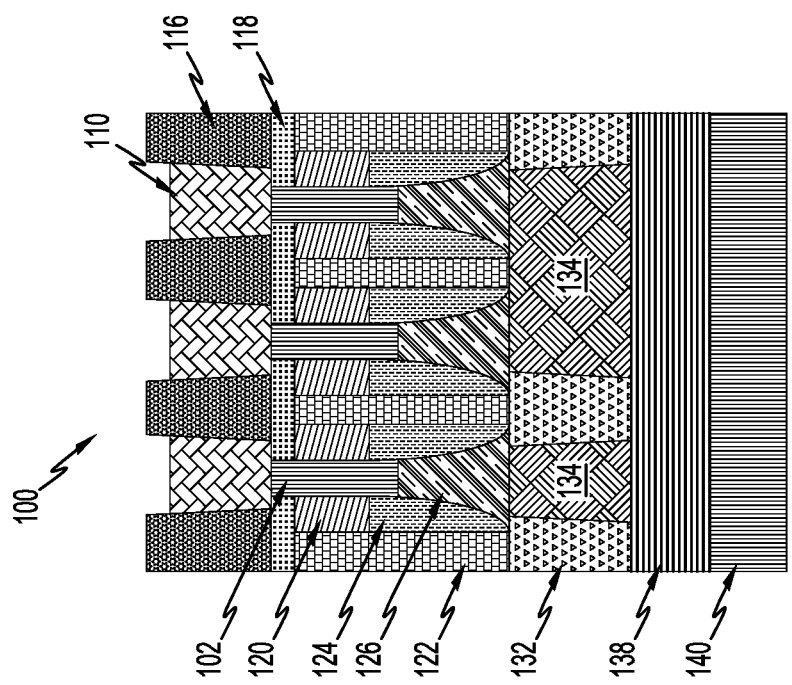

VERTICAL FIELD-EFFECT TRANSISTOR WITH ISOLATION PILLARS

BACKGROUND

Fin field-effect transistor (FiN-FET) devices include a transistor architecture that uses raised source-to-drain channel regions, referred to as fins. Known FiN-FET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field-effect transistors (VFETs) (also referred to as vertical transport field-effect transistors (VTFETs)) have become viable device options for scaling semiconductor devices (e.g., complementary metal oxide semiconductor (CMOS) devices) to 5 nanometer (nm) node and beyond. VFET devices include fin channels with source/drain regions at ends of the fin channels on top and bottom sides of the fins. Current flows through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FiN-FET-equivalent density at a larger contacted poly pitch (CPP), and providing lower MOL resistance. Present VFET devices have a bottom source/drain contact and a gate extension beyond the fins thereby providing a larger cell height.

SUMMARY

According to an exemplary embodiment, a semiconductor device comprises a first vertical field-effect transistor comprising a first set of vertical fins and a second set of vertical fins separated by a first isolation pillar structure. The semiconductor device further comprises a second vertical field-effect transistor adjacent to the first vertical field-effect transistor. The second vertical field-effect transistor comprises a first set of vertical fins and a second set of vertical fins separated by a second isolation pillar structure.

The semiconductor device of the illustrative embodiment advantageously allows for isolation pillar structures in vertical field-effect transistors to isolate, at the fin ends, adjacent vertical field-effect transistors and to remove any gate extension. In addition, the isolation pillar structures of the semiconductor device of the illustrative embodiment advantageously reduce cell height with no change in fin length thereby improving density with no significant reduction in in the effective channel width. Further, the isolation pillar structures of the semiconductor device of the illustrative embodiment advantageously form a complementary metal oxide semiconductor (CMOS) cell having a merged n-type field-effect transistor (N-FET) region and a p-type field-effect transistor (P-FET) region.

In one or more additional illustrative embodiments, as may be combined with the preceding paragraphs, the second set of vertical fins of the first vertical field-effect transistor and the first set of vertical fins of the second vertical field-effect transistor disposed between the first isolation pillar structure and the second isolation pillar structure may comprise a CMOS cell.

In one or more additional illustrative embodiments, as may be combined with the preceding paragraphs, a given one of the second set of vertical fins of the first vertical field-effect transistor may comprise an N-FET region and a given one of the first set of vertical fins of the second vertical field-effect transistor may comprise a P-FET region.

In one or more additional illustrative embodiments, as may be combined with the preceding paragraphs, the semiconductor device may further comprise a first source/drain region disposed under each vertical fin of the first set of vertical fins and the second set of vertical fins of the first vertical field-effect transistor and under each vertical fin of the first set of vertical fins and the second set of vertical fins of the second vertical field-effect transistor. The semiconductor device may further comprise the first isolation pillar structure and the second isolation pillar structure extending below the first source/drain region.

In one or more additional illustrative embodiments, as may be combined with the preceding paragraphs, the semiconductor device may further comprise a given first source/drain region connecting to a back side contact.

In one or more additional illustrative embodiments, as may be combined with the preceding paragraphs, the semiconductor device may further comprise the first isolation pillar structure and the second isolation pillar structure each independently comprising a single dielectric layer.

In one or more additional illustrative embodiments, as may be combined with the preceding paragraphs, the semiconductor device may further comprise the first isolation pillar structure and the second isolation pillar structure each independently comprising a plurality of dielectric layers.

In one or more additional illustrative embodiments, as may be combined with the preceding paragraphs, the first isolation pillar structure and the second isolation pillar structure each independently have a height greater than about 75 nanometers.

In one or more additional illustrative embodiments, as may be combined with the preceding paragraphs, the semiconductor device may further comprise each of the first set of vertical fins and the second set of vertical fins of the first vertical field-effect transistor and the first set of vertical fins and the second set of vertical fins of the second vertical field-effect transistor including a first vertical fin and a second vertical fin. The semiconductor device may further comprise a distance between the first vertical fin and the second vertical fin being less than 30 nanometers.

In one or more additional illustrative embodiments, as may be combined with the preceding paragraphs, the semiconductor device may further comprise a given first vertical fin and a given second vertical fin being isolated from a gate of each of the first vertical field-effect transistor and the second vertical field-effect transistor.

In one or more additional illustrative embodiments, as may be combined with the preceding paragraphs, the semiconductor device may further comprise a second source/drain region disposed over a top portion of each vertical fin of the first set of vertical fins and the second set of vertical fins of the first vertical field-effect transistor, and over a top portion of each vertical fin of the first set of vertical fins and the second set of vertical fins of the second vertical field-effect transistor.

Another exemplary embodiment comprises an integrated circuit comprising one or more semiconductor devices. At least one of the one or more semiconductor devices is a semiconductor device according to one or more of the foregoing illustrative embodiments.

The integrated circuit of the illustrative embodiment advantageously allows for semiconductor devices having isolation pillar structures in vertical field-effect transistors to isolate at the fin ends adjacent vertical field-effect transistors and to remove any gate extension. In addition, the isolation pillar structures of the semiconductor device of the illustrative embodiment advantageously reduce cell height with no change in fin length thereby improving density with no significant reduction in in the effective channel width. Further, the isolation pillar structures of the semiconductor device of the illustrative embodiment advantageously form a CMOS cell having a merged N-FET region and a P-FET region.

In a further exemplary embodiment, a method comprises forming a first isolation pillar structure in a set of vertical fins of a first vertical field-effect transistor. The method further comprises forming a second isolation pillar structure in a first set of vertical fins of a second vertical field-effect transistor. The second vertical field-effect transistor is adjacent to the first vertical field-effect transistor.

The method of the illustrative embodiment advantageously allows for isolation pillar structures in vertical field-effect transistors to isolate, at the fin ends, adjacent vertical field-effect transistors and to remove any gate extension. In addition, the method of the illustrative embodiment advantageously reduces cell height with no change in fin length thereby improving density with no significant reduction in in the effective channel width. Further, the method of the illustrative embodiment advantageously forms a CMOS cell having a merged N-FET region and a P-FET region.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which:

FIG. 1A is a top view illustrating a semiconductor structure for use at a first-intermediate fabrication stage, according to an illustrative embodiment.

FIG. 1B is a cross-sectional view of the semiconductor structure taken along the X-X axis of FIG. 1A at the first-intermediate fabrication stage, according to an illustrative embodiment.

FIG. 1C is a cross-sectional view of the semiconductor structure taken along the Y-Y axis of FIG. 1A at the first-intermediate fabrication stage, according to an illustrative embodiment.

FIG. 2A is a top view illustrating a semiconductor structure for use at a second-intermediate fabrication stage, according to an illustrative embodiment.

FIG. 2B is a cross-sectional view of the semiconductor structure taken along the X-X axis of FIG. 2A at the second-intermediate fabrication stage, according to an illustrative embodiment.

FIG. 2C is a cross-sectional view of the semiconductor structure taken along the Y-Y axis of FIG. 2A at the second-intermediate fabrication stage, according to an illustrative embodiment.

FIG. 3A is a cross-sectional view illustrating the semiconductor structure taken along the X-X axis of FIG. 2A at a third-intermediate fabrication stage, according to an illustrative embodiment.

FIG. 3B is a cross-sectional view illustrating the semiconductor structure taken along the Y-Y axis of FIG. 2A at the third-intermediate fabrication stage, according to an illustrative embodiment.

FIG. 5A is a cross-sectional view illustrating the semiconductor structure taken along the X-X axis of FIG. 2A at a fifth-intermediate fabrication stage, according to an illustrative embodiment.

FIG. 5B is a cross-sectional view illustrating the semiconductor structure taken along the Y-Y axis of FIG. 2A at the fifth-intermediate fabrication stage, according to an illustrative embodiment.

FIG. 8A is a top view illustrating a semiconductor structure for use at an eighth-intermediate fabrication stage, according to an illustrative embodiment.

FIG. 8B is a cross-sectional view of the semiconductor structure taken along the X-X axis of FIG. 8A at the eighth-intermediate fabrication stage, according to an illustrative embodiment.

FIG. 10A is a cross-sectional view illustrating the semiconductor structure taken along the X-X axis of FIG. 8A at a tenth-intermediate fabrication stage, according to an illustrative embodiment.

FIG. 10B is a cross-sectional view illustrating the semiconductor structure taken along the Y-Y axis of FIG. 8A at the tenth-intermediate fabrication stage, according to an illustrative embodiment.

FIG. 11A is a cross-sectional view illustrating the semiconductor structure taken along the X-X axis of FIG. 8A at an eleventh-intermediate fabrication stage, according to an illustrative embodiment.

FIG. 11B is a cross-sectional view illustrating the semiconductor structure taken along the Y-Y axis of FIG. 8A at the eleventh-intermediate fabrication stage, according to an illustrative embodiment.

DETAILED DESCRIPTION

Figures 4A, 4B:
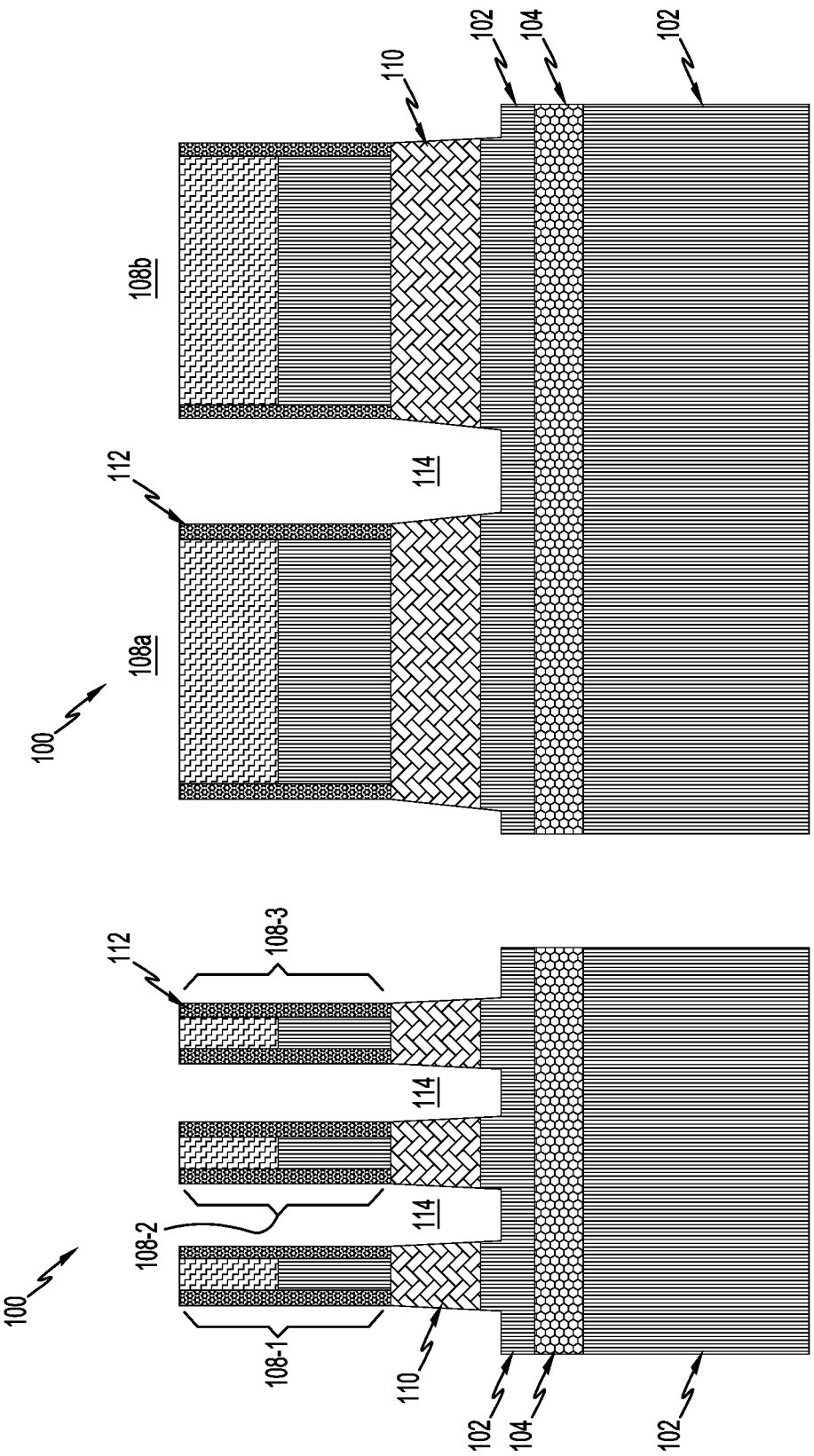
FIG. 4A is a cross-sectional view illustrating the semiconductor structure taken along the X-X axis of FIG. 2A at a fourth-intermediate fabrication stage, according to an illustrative embodiment.
FIG. 4B is a cross-sectional view illustrating the semiconductor structure taken along the Y-Y axis of FIG. 2A at the fourth-intermediate fabrication stage, according to an illustrative embodiment.

This disclosure relates generally to transistors, and more particularly to vertical fin-shaped field-effect transistors and methods for their fabrication. Exemplary embodiments will now be discussed in further detail with regard to semiconductor devices and methods of manufacturing same and, in particular, to forming isolation pillars at cell boundaries in VFET devices for improving the dimensions of the device.

VFETs are a promising option for technology scaling for 5 nm and beyond including fabricating complementary metal-oxide-semiconductor (CMOS) devices. CMOS devices are widely used, where both n-type and p-type transistors (N-FET and P-FET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

However, because future node technology requires further area scaling, reduction in cell height is an effective way for cell area reduction. Present VFETs have a bottom source/drain contact and a gate extension beyond the fins which form a cell having an undesirable cell height of, for example, approximately 120 nanometers (nm). Under certain ground rules, scaling of cell height will cause fin length reduction, which will result in an effective width (Weff) decrease per footprint.

Accordingly, non-limiting illustrative embodiments described herein overcome the above drawbacks discussed above, by significantly reducing the cell height without changing the fin length thereby improving the density and with little to no reduction in the effective channel width (Weff). The non-limiting illustrative embodiments described herein also advantageously remove the bottom source/contact by utilizing a back side source/drain contact as well as having no gate extension beyond the fin to significantly reduce the cell height, e.g., a cell height of approximately 77 nm.

It is to be understood that the various layers and/or regions shown in the accompanying drawings are not drawn to scale, and that one or more layers and/or regions of a type commonly used in, for example, field-effect transistor (FET), FiN-FET, VFET, CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

It is to be understood that the terms "about" or "substantially" as used herein with regard to thicknesses, widths, percentages, ranges, etc., are meant to denote being close or approximate to, but not exactly. For example, the terms "about" or "substantially" as used herein imply that a small margin of error may be present, such as 1% or less than the stated amount.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Referring now to the drawings in which like numerals represent the same of similar elements, FIGS. 1A-13B illustrate various processes for fabricating VFETs for improving the density with little to no reduction in Weff'. Note that the same reference numeral (100) is used to denote the semiconductor structure through the various intermediate fabrication stages illustrated in FIGS. 1A through 13B. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1A-13B are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

FIG. 1A is a top view illustrating a semiconductor structure 100 for use at a first-intermediate fabrication stage. FIG. 1B is a cross-sectional view of the semiconductor structure 100 taken along the X-X axis of FIG. 1A at the first-intermediate fabrication stage. FIG. 1C is a cross-sectional view of the semiconductor structure 100 taken along the Y-Y axis of FIG. 1A at the first-intermediate fabrication stage. Semiconductor structure 100 includes a substrate 102. The substrate 102 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

An etch stop layer 104 is formed in the substrate 102. The etch stop layer 104 may comprise a buried oxide (BOX) layer or silicon germanium (SiGe), or another suitable material such as a III-V semiconductor epitaxial layer.

FIG. 2A is a top view illustrating a semiconductor structure 100 for use at a second-intermediate fabrication stage. FIG. 2B is a cross-sectional view of the semiconductor structure 100 taken along the X-X axis of FIG. 2A at the second-intermediate fabrication stage. FIG. 2C is a cross-sectional view of the semiconductor structure 100 taken along the Y-Y axis of FIG. 2A at the second-intermediate fabrication stage. During this stage, sets of vertical fins 108*a* and 108*b* are formed. Although three vertical fins for the sets of vertical fins 108*a* and 108*b* are shown, the number of fins should not be considered limiting. Thus, a "set of vertical fins" as used herein can be considered as including one or more vertical fins. In an illustrative embodiment, the distance between the vertical fin 108-1 and vertical fin 108-2 can be less than 30 nm, e.g., from 18 nm to less than 30 nm. In an illustrative embodiment, the distance between the vertical fin 108-1 and vertical fin 108-2 can be less than 50 nm, e.g., from 18 nm to less than 50 nm. In addition, although two sets of vertical fins, i.e., a first set of vertical fins 108*a* and a second set of vertical fins 108*b* are shown, the number of sets of vertical fins should not be considered limiting and any number are contemplated.

The sets of vertical fins 108*a* and 108*b* may be formed by first depositing a hard mask layer 106 on substrate 102. The material of the hard mask layer 106 may include SiN, a multi-layer of SiN and $SiO_2$, or another suitable material. Next, fins 108-1, 108-2 and 108-3 for sets of vertical fins 108*a* and 108*b* are formed using, for example, an anisotropic etch such as reactive ion etching (RIE) that selectively removes material from the substrate 102 in regions that are not protected by hard mask layer 106. As used herein, the term "selective" in reference to a material removal process denotes that the rate of material removal for a first material is greater than the rate of removal for at least another material of the structure to which the material removal process is being applied.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point in the present embodiment include ion beam etching, plasma etching or laser ablation. Alternatively, the sets of vertical fins 108*a* and 108*b* can be formed by spacer imaging transfer.

FIGS. 3A and 3B illustrate semiconductor structure 100 at a third-intermediate fabrication stage. During this stage, bottom source/drain region 110 are formed in substrate 102 and between adjacent fins 108. One or more trenches are first formed in the substrate 102 between each vertical fin 108-1, 108-2 and 108-3 of the sets of vertical fins 108*a* and 108*b* by, for example, a wet or dry etch process. Bottom source/drain region 110 are then formed in the trenches by, for example, epitaxial growth processes. The epitaxially grown bottom source/drain region 110 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$. According to an embodiment, the bottom source/drain region 110 can be boron doped SiGe for a p-type field-effect transistor (P-FET) or phosphorous doped silicon for an n-type field-effect transistor (N-FET). It is to be understood that the term "source/drain region" as used herein means that a given source/drain region can be either a source region or a drain region, depending on the application.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used. After epi formation, drive-in anneals can be applied to move the dopants closer to the bottom of the fin channels.

FIGS. 4A and 4B illustrate semiconductor structure 100 at a fourth-intermediate fabrication stage. During this stage, a sacrificial liner 112 of, e.g., SiO₂, or TiOx is deposited on sidewalls of each vertical fin 108-1, 108-2 and 108-3 of the sets of vertical fins 108a and 108b. The sacrificial liner 112 is typically formed using a conformal deposition process. The term "conformal" denotes a layer having a thickness that does not deviate from greater than or less than 30% of an average value for the thickness of the layer. The sacrificial liner 112 can be formed using a deposition process, such as chemical vapor deposition (CVD), or the sacrificial liner 112 can be formed using an atomic layer deposition (ALD) process. Other materials including nitride may be used as the sacrificial liner 112.

Next, bottom source/drain region 110 between each fin are subjected to a trench patterning procedure, e.g., conventional lithographic and etching processes utilizing, e.g., an RIE process (with, e.g., a halogen-based plasma chemistry) between the aligned vertical fins of the sets of vertical fins 108a and 108b to selectively remove the bottom source/drain region 110 and a portion of substrate 102 between the vertical fins 108-1, 108-2 and 108-3. The etching process is selective to the material of the sacrificial liner 112 to form trench 114. In one illustrative embodiment, the trench 114 created by the etching process has a trench size that is greater at its upper end than the trench size defined in the substrate 102.

FIGS. 5A and 5B illustrate semiconductor structure 100 at a fifth-intermediate fabrication stage. During this stage, a shallow trench isolation (STI) region 116 can be formed in trench 114. STI region 116 comprises a dielectric material such as silicon oxide or silicon oxynitride, and is formed by methods known in the art. For example, in one illustrative embodiment, STI region 116 is a shallow trench isolation oxide layer.

Sacrificial liner 112 is then removed utilizing any conventional technique such as a wet or dry etching process, bottom spacer layer 118 is formed on the STI regions 116. Suitable material for bottom spacer layer 118 includes, for example, silicon boron nitride (SiBN), siliconborocarbonitride (SiBCN), silicon oxycarbonitride (SiOCN), SiN and SiOx. Bottom spacer layer 118 can be deposited using, for example, directional deposition techniques, such as a high-density plasma (HDP) deposition and gas cluster ion beam (GCIB) deposition. The directional deposition deposits the spacer material preferably on the exposed horizontal surfaces, but not on the lateral sidewalls. Alternatively, the bottom spacer layer 118 can be formed by overfilling the space with dielectric materials, followed by chemical mechanical planarization (CMP) and dielectric recess.

Figure 6B:
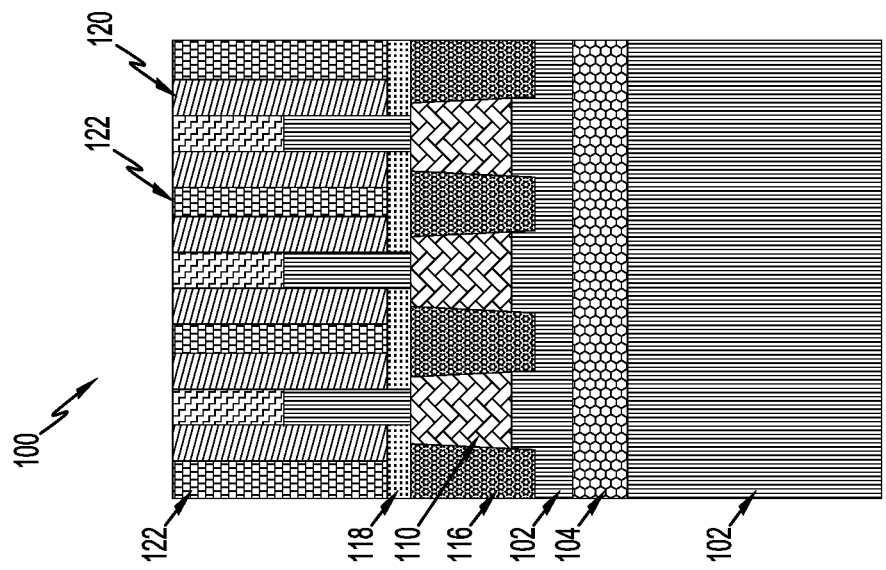
FIG. 6B is a cross-sectional view of the semiconductor structure taken along the X-X axis of FIG. 6A at the sixth-intermediate fabrication stage, according to an illustrative embodiment.
Figure 6A:
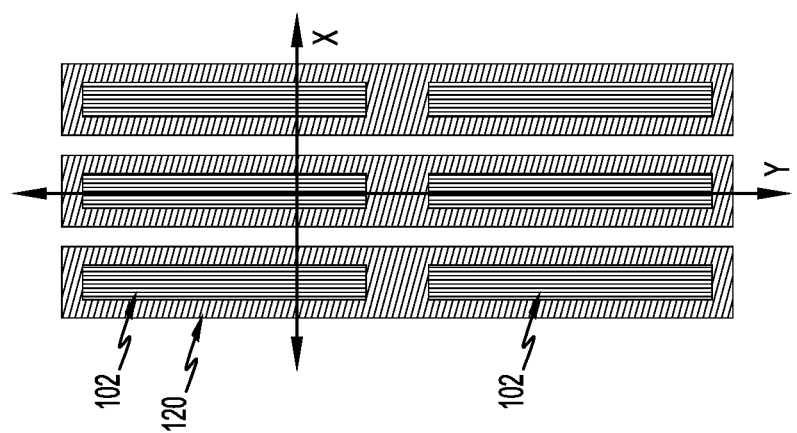
FIG. 6A is a top view illustrating a semiconductor structure for use at a sixth-intermediate fabrication stage, according to an illustrative embodiment.
Figure 6C:
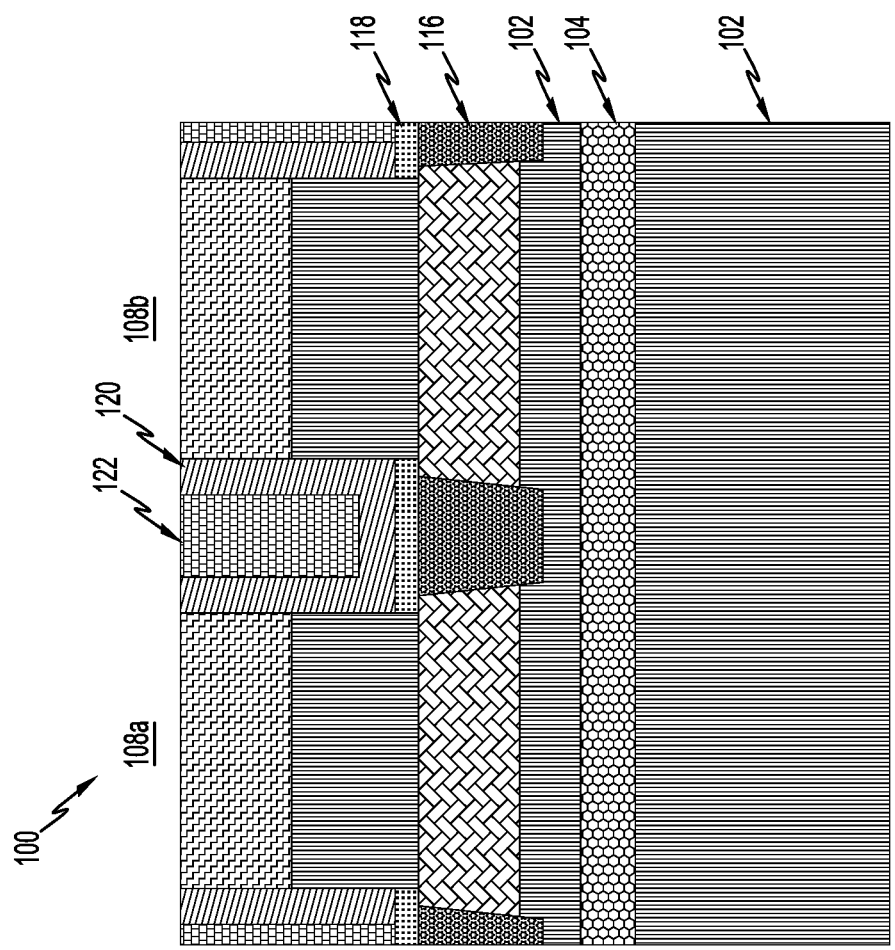
FIG. 6C is a cross-sectional view of the semiconductor structure taken along the Y-Y axis of FIG. 6A at the sixth-intermediate fabrication stage, according to an illustrative embodiment.

FIG. 6A is a top view illustrating a semiconductor structure 100 for use at a sixth-intermediate fabrication stage. FIG. 6B is a cross-sectional view of the semiconductor structure 100 taken along the X-X axis of FIG. 6A at the sixth-intermediate fabrication stage. FIG. 6C is a cross-sectional view of the semiconductor structure 100 taken along the Y-Y axis of FIG. 6A at the sixth-intermediate fabrication stage. During this stage, a gate stack layer 120 is formed on bottom spacer layer 118 and around each of vertical fins 108-1, 108-2 and 108-3 (see FIG. 5A) of the sets of vertical fins 108a and 108b. In illustrative embodiments, gate stack layer 120 is deposited on bottom spacer layer 118 and around fins 108-1, 108-2 and 108-3 employing, for example, ALD, CVD, RFCVD, plasma enhanced CVD (PECVD), physical vapor deposition (PVD), or molecular layer deposition (MLD).

The gate stack layer 120 may comprise, for example, a gate dielectric layer and a gate conductor layer. The gate dielectric layer may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg).

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

The gate stack layer 120 is then patterned to remove unwanted gate stack materials using conventional lithography and RIE techniques. An ILD layer 122 is then deposited. The ILD layer 122 includes, for example, any suitable dielectric material such as silicon oxide, silicon nitride, hydrogenated silicon carbon oxide, silicon based low-k dielectrics, flowable oxides, porous dielectrics, or organic dielectrics including porous organic dielectrics. Non-limiting examples of suitable low-k dielectric materials include a spin-on-glass, a flowable oxide, a high-density plasma oxide, borophosphosilicate glass (BPSG), or any combination thereof. The ILD layer 122 may be formed in the trenches using any suitable deposition techniques including CVD, ALD, PVD, PECVD, chemical solution deposition or other like processes. ILD layer 122 is then planarized by, for example, a planarization process such as CMP.

Figure 7B:
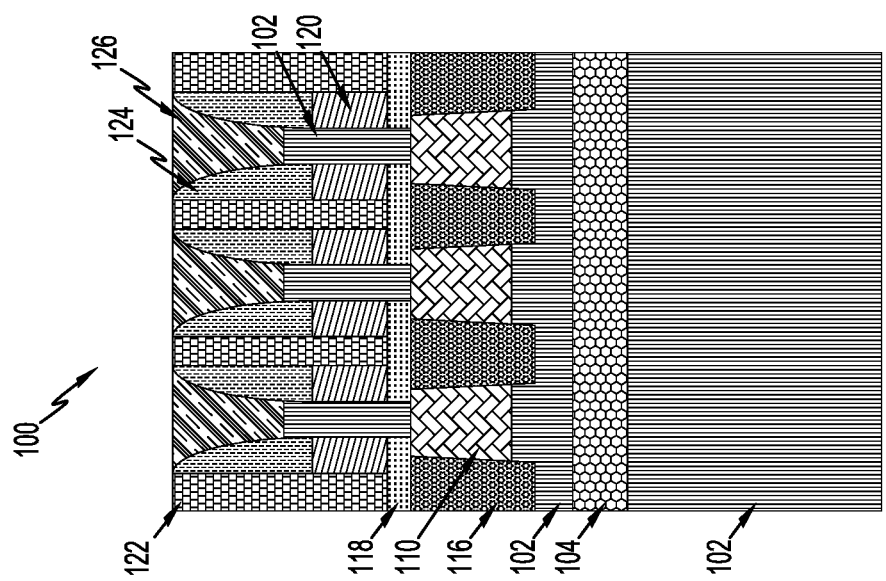
FIG. 7B is a cross-sectional view illustrating the semiconductor structure taken along the X-X axis of FIG. 7A at the seventh-intermediate fabrication stage, according to an illustrative embodiment.
Figure 7A:
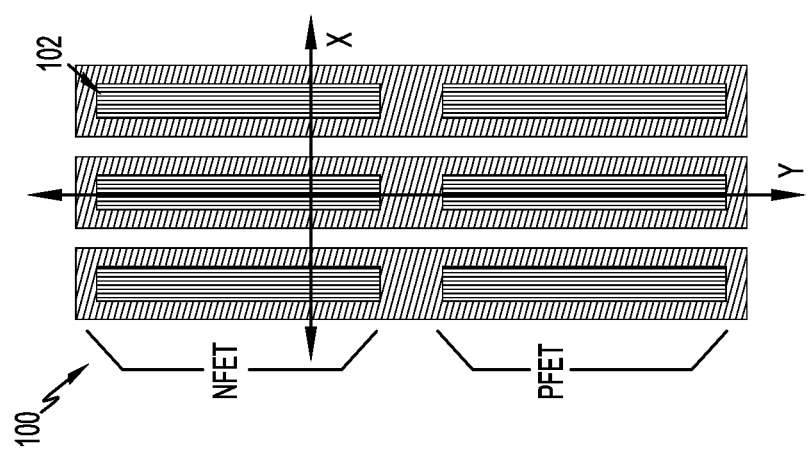
FIG. 7A is a top view illustrating a semiconductor structure for use at a seventh-intermediate fabrication stage, according to an illustrative embodiment.
Figure 7C:
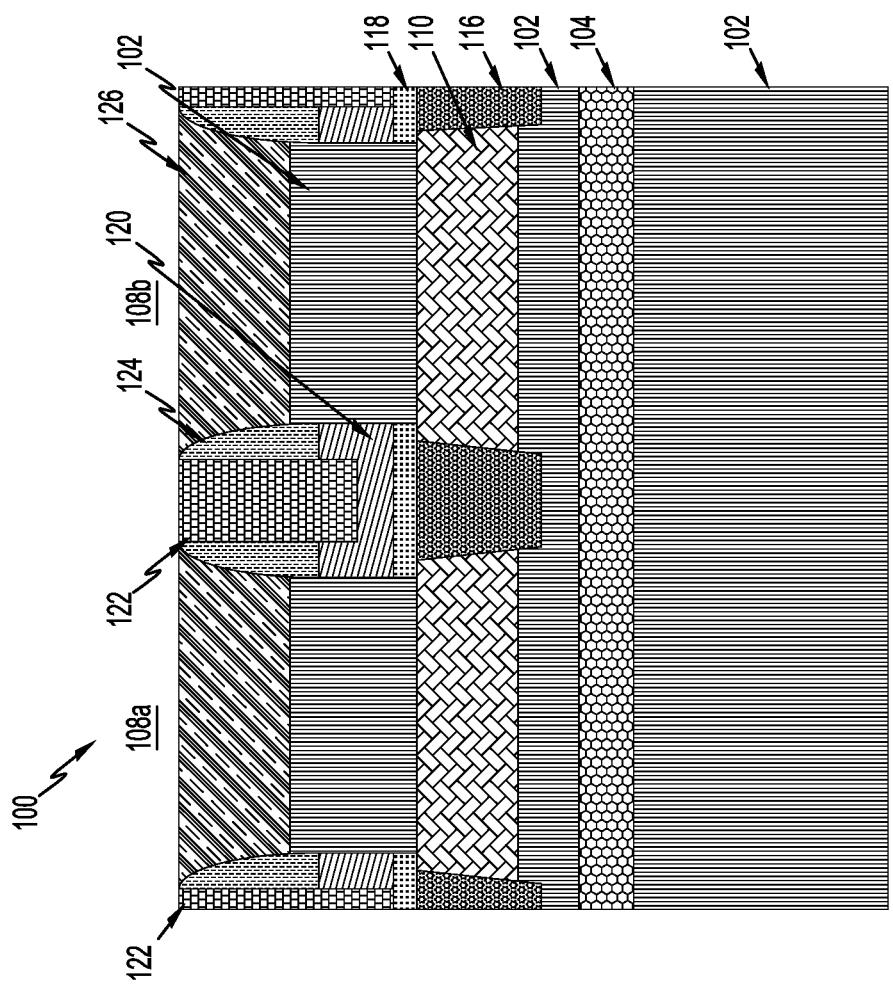
FIG. 7C is a cross-sectional view illustrating the semiconductor structure taken along the Y-Y axis of FIG. 7A at the seventh-intermediate fabrication stage, according to an illustrative embodiment.

FIG. 7A is a top view illustrating a semiconductor structure 100 for use at a seventh-intermediate fabrication stage. FIG. 7B is a cross-sectional view of the semiconductor structure 100 taken along the X-X axis of FIG. 7A at the seventh-intermediate fabrication stage. FIG. 7C is a cross-sectional view of the semiconductor structure 100 taken along the Y-Y axis of FIG. 7A at the seventh-intermediate fabrication stage. During this stage, hard mask layer 106 is removed from vertical fins 108-1, 108-2 and 108-3 and gate stack layer 120 is selectively recessed by any conventional etching process to expose a top portion of each fin of the sets of vertical fins 108a and 108b. Suitable etching processes include, for example, a dry etch process such as plasma etching or RIE, or a wet etching, that are selective to gate stack layer 120 relative to ILD layer 122.

A top spacer 124 is then formed on the gate stack layer 120 and sidewalls of ILD layer 122 and exposing the top portion of each vertical fin 108-1, 108-2 and 108-3 of the sets of vertical fins 108a and 108b. The top spacer 124 includes, for example, silicon nitride (SiN), silicon boron nitride (SiBN), siliconborocarbonitride (SiBCN), or silicon oxycarbonitride (SiOCN). In illustrative embodiments, the top spacer 124 is conformally deposited using deposition techniques including, for example, CVD, PECVD, RFCVD, PVD, ALD, MLD, MBD, PLD, LSMCD, sputtering, and/or plating.

A top source/drain region 126 is formed on the exposed top portion of each fin of the sets of vertical fins 108a and 108b. The top source/drain region 126 is epitaxially grown from the upper portions of the exposed fins using epitaxial growth processes as described above. The epitaxially grown top source/drain region 126 can be formed in different epitaxial growth processes from each other and can be in-situ doped to be either a P-FET, or N-FET. In non-limiting illustrative embodiments, FIG. 7A shows that the top source/drain region 126 and bottom source/drain region 110 for the set of vertical fins 108a are both N-FETs, and the top source/drain region 126 and bottom source/drain region 110 for the set of vertical fins 108b are both P-FETs. However, it is contemplated that the top source/drain region 126 and bottom source/drain region 110 for the set of vertical fins 108a can both be P-FETs, and the top source/drain region 126 and bottom source/drain region 110 for the set of vertical fins 108b can both be N-FETs.

Figure 8C:
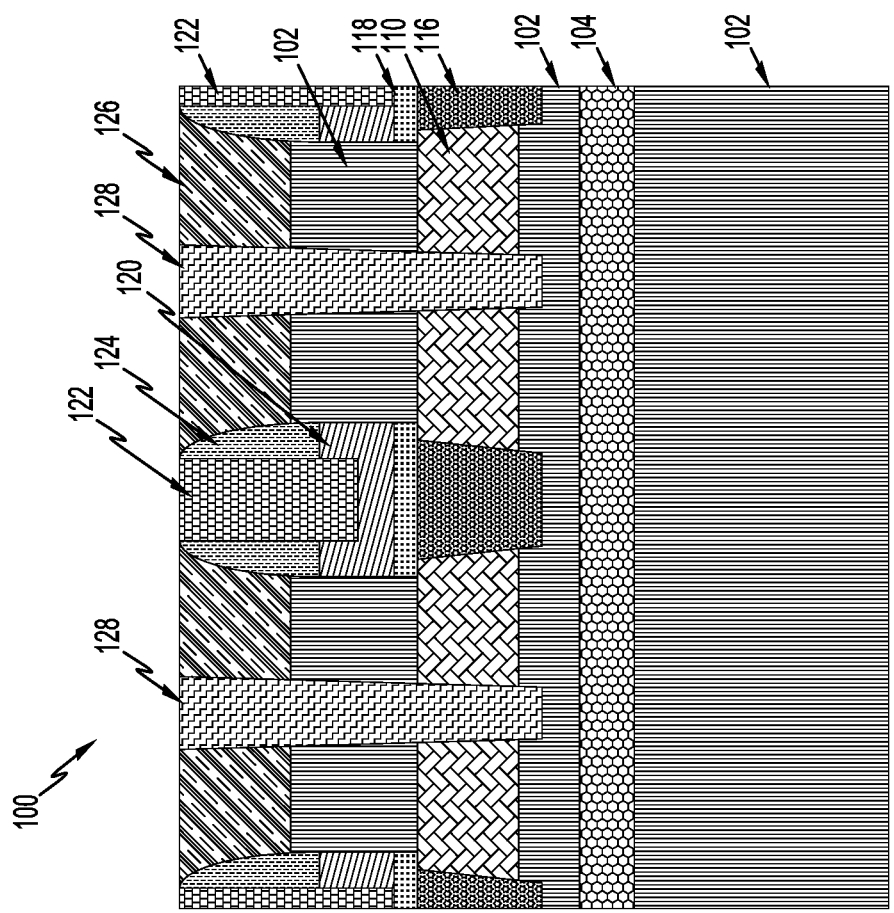
FIG. 8C is a cross-sectional view of the semiconductor structure taken along the Y-Y axis of FIG. 8A at the eighth-intermediate fabrication stage, according to an illustrative embodiment.

FIG. 8A is a top view illustrating a semiconductor structure 100 for use at an eighth-intermediate fabrication stage. FIG. 8B is a cross-sectional view of the semiconductor structure 100 taken along the X-X axis of FIG. 8A at the eighth-intermediate fabrication stage. FIG. 8C is a cross-sectional view of the semiconductor structure 100 taken along the Y-Y axis of FIG. 8A at the eighth-intermediate fabrication stage. During this stage, isolation dielectric pillars 128 are formed, as shown in FIGS. 8A and 8C, by depositing, for example, a material of a hard mask layer over the structure (not shown), followed by lithographic processing to result in a patterned hard mask layer. The material of the hard mask layer may include SiN, a multi-layer of SiN and $SiO_2$, or another suitable material.

FIG. 8C shows isolation dielectric pillars 128 within the sets of vertical fins 108a and 108b and through the top source/drain region 126, bottom source/drain region 110 and into substrate 102. Isolation dielectric pillars 128 are formed by performing a cut to form an opening and then depositing one or more dielectric materials in the openings using any conventional deposition technique such as ALD, followed by planarization using CMP or any other suitable planarization process. Suitable one or more dielectrics include, for example, SiN, $SiO_2$, SiOC, SiOCN, SiBCN, SiC, etc. In illustrative embodiments, the isolation dielectric pillars 128 extend beyond the bottom source/drain region 110. In an illustrative embodiment, isolation dielectric pillars 128 can have a height greater than 75 nm and up to 120 nm. In an illustrative embodiment, the isolation dielectric pillars 128 can include a single dielectric layer. In another illustrative embodiment, the isolation dielectric pillars 128 can include a plurality of dielectric layers.

The hard mask layer can then be removed by any suitable etching technique. FIG. 8A shows that the resulting isolation dielectric pillars 128 at the cell boundaries allows for the formation of a CMOS device by forming a cell structure 130 containing an N-FET and a P-FET merged device.

Figure 9B:
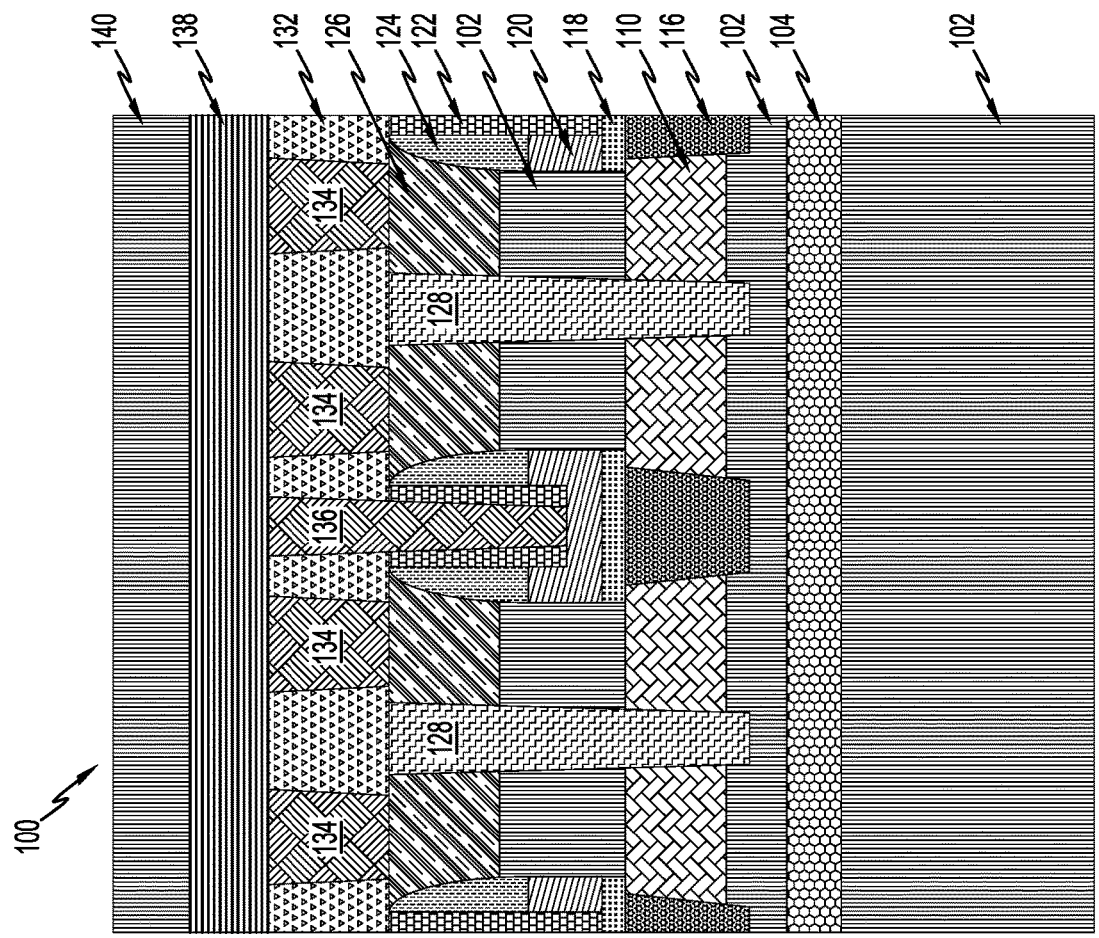
FIG. 9B is a cross-sectional view illustrating the semiconductor structure taken along the Y-Y axis of FIG. 8A at the ninth-intermediate fabrication stage, according to an illustrative embodiment.
Figure 9A:
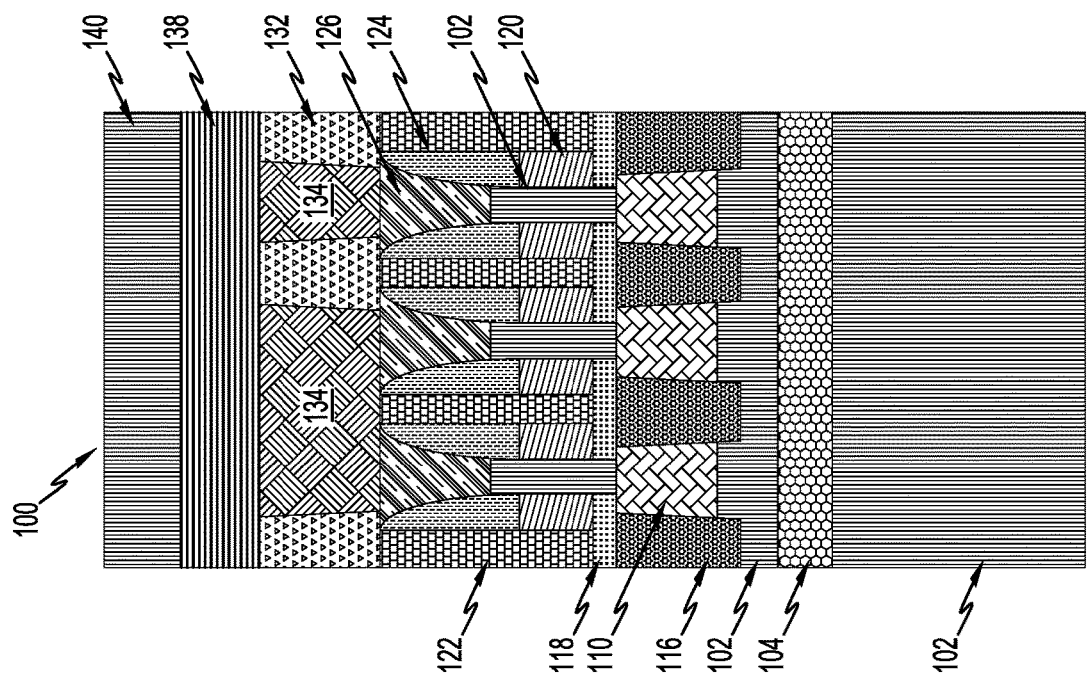
FIG. 9A is a cross-sectional view illustrating the semiconductor structure taken along the X-X axis of FIG. 8A at a ninth-intermediate fabrication stage, according to an illustrative embodiment.

FIGS. 9A and 9B illustrate semiconductor structure 100 at a ninth-intermediate fabrication stage. During this stage, middle-of-the-line contacts including top source/drain contact 134 and gate contact 136 are formed by any conventional technique. For example, an ILD layer 132 is first deposited on the top surface of semiconductor structure 100. ILD layer 122 can be of a similar material and deposited in a similar manner as ILD layer 122. Top source/drain contact 134 and gate contact 136 can be formed by patterning ILD layer 132 and utilizing conventional lithographic and etching processes to form a via. Next, contact metallization is performed by, for example, forming a silicide liner, such as Ti, Ni, or NiPt, followed by an adhesion metal liner, such as TiN, TaN, followed by a conductive metal, such as tungsten (W), aluminum (Al), copper (Cu), cobalt (Co), ruthenium (Ru), molybdenum (Mo), or any other suitable conductive material. In various embodiments, the high conductance metal can be deposited by CVD, PVD, ALD, and/or plating. The contact metal can be planarized using, for example, a planarizing process such as CMP. Other planarization processes can include grinding and polishing.

BEOL interconnects 138 are then formed on semiconductor structure 100 utilizing conventional techniques. The BEOL interconnects 138 include various BEOL interconnect structures. A carrier wafer 140 may be formed of materials similar to that of the substrate 102, and may be formed over the BEOL interconnects 138 using a wafer bonding process, such as dielectric-to-dielectric bonding.

FIGS. 10A and 10B illustrate semiconductor structure 100 at a tenth-intermediate fabrication stage. Using the carrier wafer 140, the structure may be "flipped" over so that the back side of the substrate 102 (i.e., the back surface) is facing up for back side processing as shown and portions of the substrate 102 may be removed from the back side using, for example, a wet etch to selectively remove substrate 102 until the etch stop layer 104 is reached.

FIGS. 11A and 11B illustrate semiconductor structure 100 at an eleventh-intermediate fabrication stage. During this stage, the etch stop layer 104 is selectively removed, followed by removal of the remaining portions of the substrate 102. The etch stop layer 104 and substrate 102 can be selectively removed utilizing any suitable wet or dry etching process.

Figure 12B:
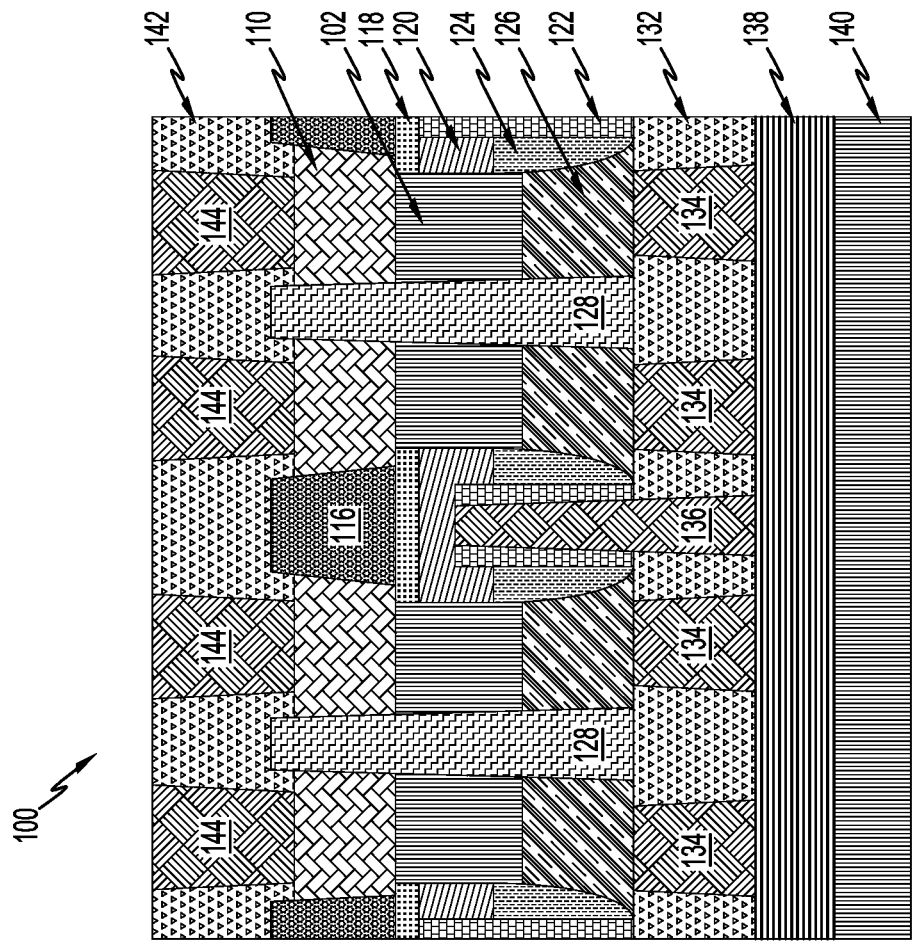
FIG. 12B is a cross-sectional view illustrating the semiconductor structure taken along the Y-Y axis of FIG. 8A at the twelfth-intermediate fabrication stage, according to an illustrative embodiment.
Figure 12A:
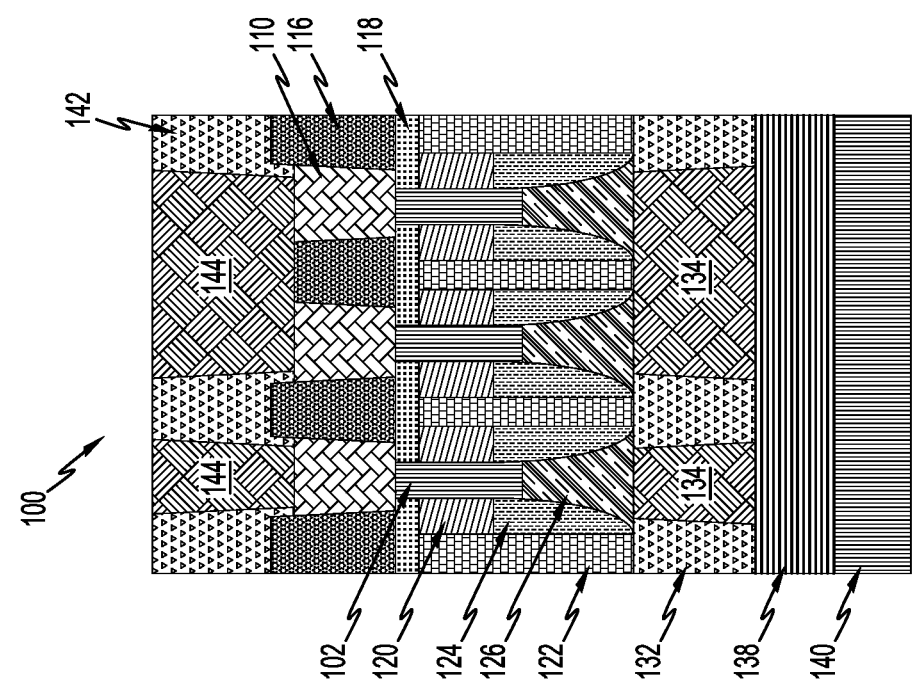
FIG. 12A is a cross-sectional view illustrating the semiconductor structure taken along the X-X axis of FIG. 8A at a twelfth-intermediate fabrication stage, according to an illustrative embodiment.

FIGS. 12A and 12B illustrate semiconductor structure 100 at a twelfth-intermediate fabrication stage. During this stage, ILD layer 142 is deposited on the back side of the structure. The ILD layer 142 can be of a similar material and deposited in a similar manner as ILD layer 122. ILD layer 142 may initially be overfilled, followed by planarization (e.g., using CMP) stopping on the bottom source/drain region 110, STI regions 116 and isolation dielectric pillars 128.

Next, ILD layer 142 is patterned for forming back side contacts 144 in ILD layer 142. For example, a hard mask (not shown) can be deposited by any conventional technique and then the exposed regions of ILD layer 142 are removed using a selective etching process that removes the unprotected regions, e.g., a directional etch such as RIE. A metal fill is then deposited in the openings to form back side contacts 144. Back side contacts 144 can include a silicide liner, such as Ti, Ni, or NiPt, followed by an adhesion metal liner, such as TiN, TaN, followed by a conductive metal as discussed above. The back side contacts 144 can be planarized by any planarizing process such as CMP. Other planarization processes can include grinding and polishing.

Figure 13B:
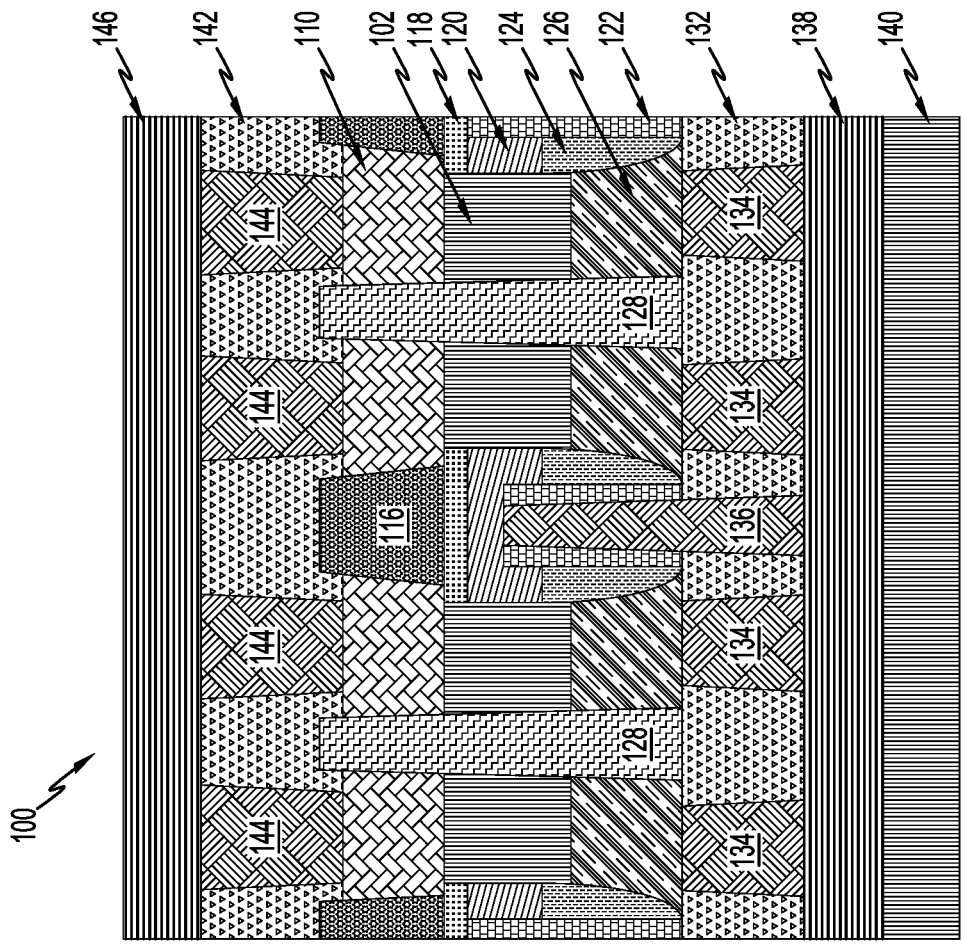
FIG. 13B is a cross-sectional view illustrating the semiconductor structure taken along the Y-Y axis of FIG. 8A at the thirteenth-intermediate fabrication stage, according to an illustrative embodiment.
Figure 13A:
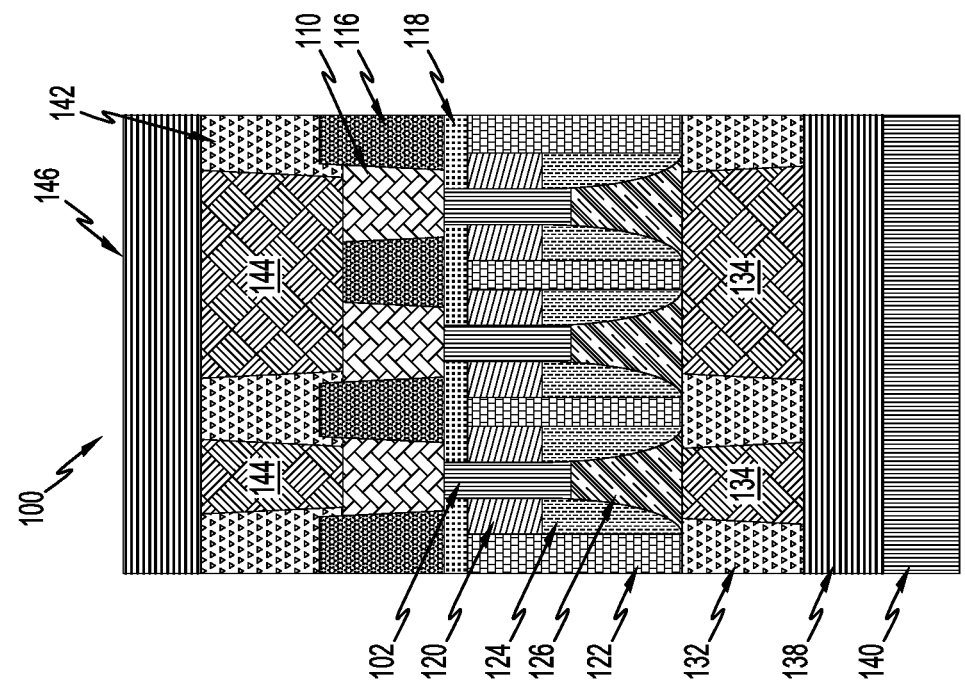
FIG. 13A is a cross-sectional view illustrating the semiconductor structure taken along the X-X axis of FIG. 8A at a thirteenth-intermediate fabrication stage, according to an illustrative embodiment.

FIGS. 13A and 13B illustrate semiconductor structure 100 at a thirteenth-intermediate fabrication stage. During this stage, back side interconnects 146 may be formed with similar sizing and composition as that of the BEOL interconnects 138.

It is to be understood that the semiconductor devices and methods for forming same in accordance with embodiments described herein (e.g., a VFET) can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with non-limiting illustrative embodiments can be employed in applications, hardware, and/or electronic systems. Suitable hardware and systems for implementing the non-limiting illustrative embodiments may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the non-limiting illustrative embodiments provided herein, one of ordinary skill in the art will be able to contemplate other implementations and applications of the techniques described herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
 a first vertical field-effect transistor comprising a first set of vertical fins and a second set of vertical fins separated by a first isolation pillar structure, wherein the first isolation pillar structure extends beyond respective ends of the first set of vertical fins and the second set of vertical fins of the first vertical field-effect transistor, and wherein respective ends of the first isolation pillar structure abut a first interlayer dielectric and a second interlayer dielectric; and
 a second vertical field-effect transistor adjacent to the first vertical field-effect transistor, the second vertical field-effect transistor comprising a first set of vertical fins and a second set of vertical fins separated by a second isolation pillar structure, wherein the second isolation pillar structure extends beyond respective ends of the first set of vertical fins and the second set of vertical fins of the second vertical field-effect transistor, and wherein respective ends of the second isolation pillar structure abut the first interlayer dielectric and the second interlayer dielectric.

2. The semiconductor device of claim 1, wherein the second set of vertical fins of the first vertical field-effect transistor and the first set of vertical fins of the second vertical field-effect transistor disposed between the first isolation pillar structure and the second isolation pillar structure comprise a complementary metal oxide semiconductor cell.

3. The semiconductor device of claim 2, wherein the second set of vertical fins of the first vertical field-effect transistor comprises an n-type field-effect transistor region and the first set of vertical fins of the second vertical field-effect transistor comprises a p-type field-effect transistor region.

4. The semiconductor device of claim 1, further comprising a first source/drain region disposed under each vertical fin of the first set of vertical fins and the second set of vertical fins of the first vertical field-effect transistor and under each vertical fin of the first set of vertical fins and the second set of vertical fins of the second vertical field-effect transistor;
   wherein the first isolation pillar structure and the second isolation pillar structure extend below the first source/drain region.

5. The semiconductor device of claim 4, wherein the first source/drain region connects to a back side contact.

6. The semiconductor device of claim 1, wherein the first isolation pillar structure and the second isolation pillar structure each comprise a single dielectric layer.

7. The semiconductor device of claim 1, wherein the first isolation pillar structure and the second isolation pillar structure each comprise a plurality of dielectric layers.

8. The semiconductor device of claim 1, wherein each of the first set of vertical fins and the second set of vertical fins of the first vertical field-effect transistor and the first set of vertical fins and the second set of vertical fins of the second vertical field-effect transistor includes a first vertical fin and a second vertical fin; and wherein a distance between the first vertical fin and the second vertical fin is less than about 30 nanometers.

9. The semiconductor device of claim 8, wherein the first vertical fin and the second vertical fin are isolated from a gate of each of the first vertical field-effect transistor and the second vertical field-effect transistor.

10. The semiconductor device of claim 3, further comprising a second source/drain region disposed over a top portion of each vertical fin of the first set of vertical fins and the second set of vertical fins of the first vertical field-effect transistor, and over a top portion of each vertical fin of the first set of vertical fins and the second set of vertical fins of the second vertical field-effect transistor.

11. An integrated circuit, comprising:
   one or more semiconductor devices, wherein at least one of the one or more semiconductor devices comprises:
   a first vertical field-effect transistor comprising a first set of vertical fins and a second set of vertical fins separated by a first isolation pillar structure, wherein the first isolation pillar structure extends beyond respective ends of the first set of vertical fins and the second set of vertical fins of the first vertical field-effect transistor, and wherein respective ends of the first isolation pillar structure abut a first interlayer dielectric and a second interlayer dielectric; and
   a second vertical field-effect transistor adjacent to the first vertical field-effect transistor, the second vertical field-effect transistor comprising a first set of vertical fins and a second set of vertical fins separated by a second isolation pillar structure, wherein the second isolation pillar structure extends beyond respective ends of the first set of vertical fins and the second set of vertical fins of the second vertical field-effect transistor, and wherein respective ends of the second isolation pillar structure abut the first interlayer dielectric and the second interlayer dielectric.

12. The integrated circuit of claim 11, wherein the second set of vertical fins of the first vertical field-effect transistor and the first set of vertical fins of the second vertical field-effect transistor disposed between the first isolation pillar structure and the second isolation pillar structure comprise a complementary metal oxide semiconductor cell.

13. The integrated circuit of claim 12, wherein the second set of vertical fins of the first vertical field-effect transistor comprises an n-type field-effect transistor region and the first set of vertical fins of the second vertical field-effect transistor comprises a p-type field-effect transistor region.

14. The integrated circuit of claim 11, wherein the at least one of the one or more semiconductor devices further comprises:
   a first source/drain region is disposed under each vertical fin of the first set of vertical fins and the second set of vertical fins of the first vertical field-effect transistor and under each vertical fin of the first set of vertical fins and the second set of vertical fins of the second vertical field-effect transistor;
   wherein the first isolation pillar structure and the second isolation pillar structure extend below the first source/drain region.

15. The integrated circuit of claim 14, wherein the first source/drain region connects to a back side contact.

16. The integrated circuit of claim 11, wherein the first isolation pillar structure and the second isolation pillar structure each comprise a single dielectric layer.

17. The integrated circuit of claim 11, wherein the first isolation pillar structure and the second isolation pillar structure each comprise a plurality of dielectric layers.

18. The integrated circuit of claim 11, wherein each of the first set of vertical fins and the second set of vertical fins of the first vertical field-effect transistor and the first set of vertical fins and the second set of vertical fins of the second vertical field-effect transistor includes a first vertical fin and a second vertical fin; and wherein a distance between the first vertical fin and the second vertical fin is less than 30 nanometers.

19. The integrated circuit of claim 18, wherein the at least one of the one or more semiconductor devices further comprises a second source/drain region disposed over a top portion of each vertical fin of the first set of vertical fins and the second set of vertical fins of the first vertical field-effect transistor, and over a top portion of each vertical fin of the first set of vertical fins and the second set of vertical fins of the second vertical field-effect transistor.

20. A method, comprising:
   forming a first isolation pillar structure in a first set of vertical fins of a first vertical field-effect transistor, wherein the first isolation pillar structure extends beyond respective ends of the first set of vertical fins of the first vertical field-effect transistor, and wherein respective ends of the first isolation pillar structure abut a first interlayer dielectric and a second interlayer dielectric; and
   forming a second isolation pillar structure in a first set of vertical fins of a second vertical field-effect transistor, wherein the second isolation pillar structure extends beyond respective ends of the first set of vertical fins of the second vertical field-effect transistor, and wherein respective ends of the second isolation pillar structure abut the first interlayer dielectric and the second interlayer dielectric;
   wherein the second vertical field-effect transistor is adjacent to the first vertical field-effect transistor.

* * * * *